United States Patent [19]

Takeyama

[11] Patent Number: 4,888,777
[45] Date of Patent: Dec. 19, 1989

[54] SEMICONDUCTOR LASER CONTROL APPARATUS

[75] Inventor: Yoshinobu Takeyama, Kawasaki, Japan

[73] Assignee: Ricoh Company, Ltd., Tokyo, Japan

[21] Appl. No.: 307,427

[22] Filed: Feb. 7, 1989

[30] Foreign Application Priority Data

Feb. 10, 1988 [JP] Japan .................................. 63-29539

[51] Int. Cl.⁴ ................................................ H01S 3/00
[52] U.S. Cl. ......................................... 372/38; 372/25; 372/26; 372/29
[58] Field of Search .............. 378/38, 26, 8, 29, 34–36

[56] References Cited

U.S. PATENT DOCUMENTS 4,695,714  9/1988  Kimizuka et al. .................... 372/34
4,710,631 12/1987  Aotsuka et al. ....................... 376/34
4,813,046  3/1989  Shimada .............................. 372/38

Primary Examiner—Leon Scott, Jr.
Attorney, Agent, or Firm—Cooper & Dunham

[57] ABSTRACT

A semiconductor laser control apparatus for controlling an optical output of a semiconductor laser comprises a correcting part supplied with a modulation signal which determines ON and OFF states of the semiconductor laser for outputting a processed modulation signal, and a driving circuit supplied with the processed modulation signal from the correcting part for supplying a driving signal to the semiconductor laser. The correcting part includes a differentiating circuit responsive to the processed modulation signal for supplying a correction signal having a predetermined time constant to the driving circuit when the semiconductor laser is ON so as to maintain the optical output of the semiconductor laser constant, and a pulse width correcting circuit for correcting a pulse width of the modulation signal to obtain the processed modulation signal. The processed modulation signal is supplied to the driving circuit so that the semiconductor laser is ON and operates until a time which is delayed by a predetermined delay time from an operation end time determined by the modulation signal.

11 Claims, 7 Drawing Sheets (A)
(B)
PRIOR ART
(C)

→ TIME

FIG. 5B cc1 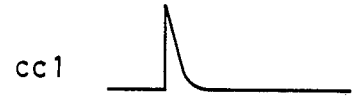
FIG. 5C cc2 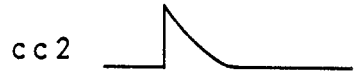
FIG. 5D cc3 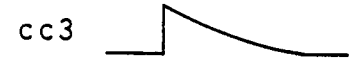
FIG. 5E Iop 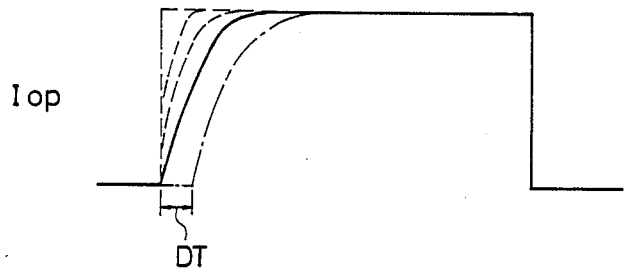

SEMICONDUCTOR LASER CONTROL APPARATUS

BACKGROUND OF THE INVENTION

The present invention generally relates to semiconductor laser control apparatuses, and more particularly to a semiconductor laser control apparatus for controlling a semiconductor laser which is used as a laser light source in an optical image forming apparatus including a laser printer, a laser facsimile machine and the like.

As is well known, a semiconductor laser control apparatus is used to control an optical output of a semiconductor laser which is used as a light source of an optical image forming apparatus. A known semiconductor laser control apparatus detects the optical output of the semiconductor laser and compares the detected optical output with a reference value. An up-down counter counts up or down depending on a result of the comparison, and a driving current dependent on a counted value of the up-down counter is supplied to the semiconductor laser.

However, in this semiconductor laser control apparatus, the optical output of the semiconductor laser may deviate due to a thermal coupling of the semiconductor laser. For this reason, even when the optical output of the semiconductor laser is detected and the driving current supplied to the semiconductor laser is adjusted to a constant value, the optical output at a time when the semiconductor laser turns ON may become larger than the optical output determined by the driving current and then settle to a set value with a certain time constant.

In this case, when a modulation signal shown in FIG. 1(A) turns the semiconductor laser ON and OFF and a driving current shown in FIG. 1(B) is supplied to the semiconductor laser, the optical output of the semiconductor laser deviates in a vicinity of the rising edge as shown in FIG. 1(C). Such a deviation of the optical output causes an inconsistent image density and may make it impossible to reproduce with a high fidelity halftone images on a laser printer and the like which uses the semiconductor laser as the laser light source.

Accordingly, it is possible to consider controlling the optical output of the semiconductor laser by a conceivable semiconductor laser control apparatus shown in FIG. 2. This conceivable semiconductor laser control apparatus has a driving circuit 2 for supplying a driving current to a semiconductor laser 1, a rise timing correction circuit 3 coupled to the driving circuit 2, and a differentiating circuit 4 coupled between the driving circuit 2 and the rise timing correction circuit 3. A modulation signal is supplied to the rise timing correction circuit 3 through a terminal 5. The rise timing correction circuit 3 in combination with the differentiating circuit 4 act as a correcting means for supplying to the semiconductor laser 1 a correction current having a predetermined time constant when the semiconductor laser 1 is ON.

The rise timing correction circuit 3 may have a circuit construction shown in FIG. 3. In FIG. 3, the modulation signal from the terminal 5 is delayed in a delay line 3a and supplied to a terminal 31. On the other hand, the modulation signal from the terminal 5 is supplied as it is to a terminal 32. A delayed modulation signal from the terminal 31 is supplied to the driving circuit 2 shown in FIG. 2 as a phase delayed signal so as to adjust a timing with which the correction is made with respect to the optical output of the semiconductor laser 1. The undelayed modulation signal from the terminal 32 is supplied to the differentiating circuit 4. Hence, the delay line 3a is necessary only when the correction timing is required.

The differentiating circuit 4 shown in FIG. 2 differentiates the modulation signal which is to be supplied to the driving circuit 2, so as to supply a predetermined correction current to the semiconductor laser 1 when the semiconductor laser 1 is ON and correct the deviation in the optical output of the semiconductor laser 1.

In a case where the semiconductor laser 1 the optical output of which is to be corrected has an output characteristic with n kinds of time constants, the differentiating circuit 4 is constituted by n differentiators $4_1$ through $4_n$ which are coupled in parallel as shown in FIG. 4. The differentiators $4_1$ through $4_n$ respectively provide correction quantities respectively corresponding to the time constants of the output characteristic of the semiconductor laser 1. In FIG. 4, those parts which are essentially the same as those corresponding parts in FIG. 2 are designated by the same reference numerals, and a description thereof will be omitted.

The differentiating circuit 4 and the differentiators $4_1$ through $4_n$ may have a known simple construction including a resistor and a capacitor or may additionally have an operational amplifier.

According to the conceivable semiconductor laser control apparatuses shown in FIGS. 2 and 4, the phase of the modulation signal received at the terminal 5 is adjusted in the rise timing correction circuit 3 so that the modulation signals supplied to the driving circuit 2 and the differentiating circuit 3 have an appropriate phase relationship.

But according to such conceivable semiconductor laser control apparatuses, the deviation of the optical output of the semiconductor laser 1 is suppressed by setting the time constant and the current quantity (quantity corresponding to n=1, n=2 and n=3 in FIG. 5A which shows the optical output of the semiconductor laser 1) to one of correction currents CC1, CC2 and CC3 respectively shown in FIGS. 5B, 5C and 5D so as to correct the deviation of the optical output of the semiconductor laser 1 when no correction is made. Hence, a rising edge of a driving current $I_{op}$ with respect to the semiconductor laser 1 after the correction is slow with respect to a rising edge of the modulation signal, as shown in FIG. 5E. When the correction quantity is large, a rise start time corresponding to a time when the semiconductor laser 1 turns ON responsive to a driving current with which a predetermined optical output is obtained becomes delayed by a delay time DT as indicated by a one-dot chain line in FIG. 5E. In this case, with respect to the operating time of the semiconductor laser 1 responsive to the modulation signal shown in FIG. 6(A), a time in which the driving current Iop after the correction shown in FIG. 6(B) is supplied to the semiconductor laser 1 becomes shortened by the effect of the delay time DT. FIG. 6(C) shows the optical output of the semiconductor laser 1 after the correction. Therefore, the time in which the semiconductor laser 1 should operate responsive to the modulation signal and the time in which the driving current $I_{op}$ after the correction is actually supplied to the semiconductor laser 1 do not coincide. As a result, there are problems in that the duty characteristic of the optical output of the semiconductor laser 1 becomes deteriorated and it no longer becomes possible to reproduce the image with a high fidelity.

SUMMARY OF THE INVENTION

Accordingly, it is a general object of the present invention to provide a novel and useful semiconductor laser control apparatus in which the problems described heretofore are eliminated.

Another and more specific object of the present invention is to provide a semiconductor laser control apparatus for controlling an optical output of a semiconductor laser and comprising terminal means for receiving a modulation signal which determines ON and OFF states of the semiconductor laser, correcting means supplied with the modulation signal from the terminal means for outputting a processed modulation signal, and driving means supplied with the processed modulation signal from the correcting means for supplying a driving signal to the semiconductor laser. The correcting means includes differentiating means responsive to the processed modulation signal for supplying a correction signal having a predetermined time constant to the driving means when the semiconductor laser is ON so as to maintain the optical output of the semiconductor laser constant, and pulse width correcting means for correcting a pulse width of the modulation signal to obtain the processed modulation signal, the processed modulation signal being supplied to the driving means so that the semiconductor laser is ON and operates until a time which is delayed by a predetermined delay time from an operation end time determined by the modulation signal received at the terminal means. According to the semiconductor laser control apparatus of the present invention, the applying time of the modulation signal coincides with the applying time of the actual corrected driving signal (current). As a result, it is possible to reproduce an image depending on the modulation signal with a high fidelity when the present invention is applied to an optical image forming apparatus including a laser printer, a laser facsimile and the like.

Other objects and further features of the present invention will be apparent from the following detailed description when read in conjunction with the accompanying drawings.

BRIEF DESCRIPTION OF THE DRAWINGS

FIGS. 5A through 5E show waveforms for explaining the problems of the conceivable semiconductor laser control apparatuses;

DETAILED DESCRIPTION

Figure 1:
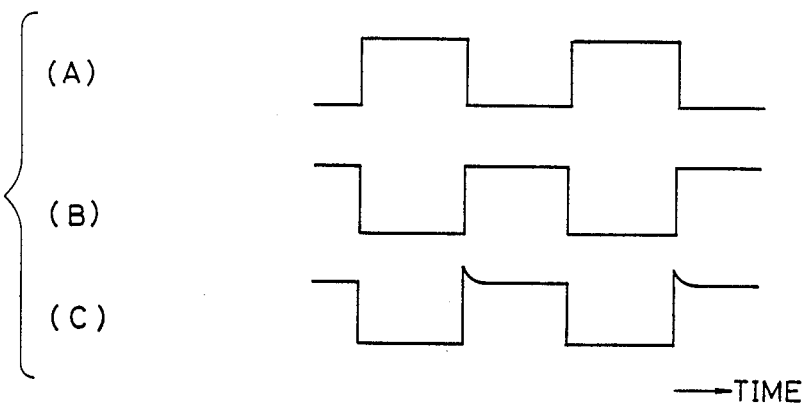
FIGS. 1(A) through 1(C) are timing charts for explaining the operation of a known semiconductor laser control apparatus.
Figure 2:
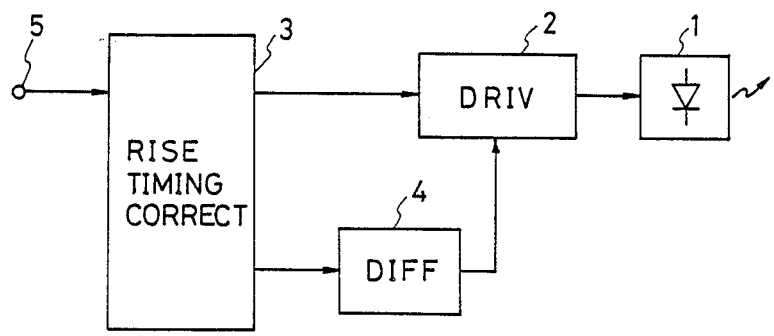
FIG. 2 is a system block diagram showing a conceivable semiconductor laser control apparatus.
Figure 3:
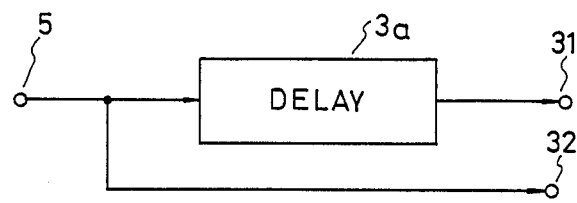
FIG. 3 is a system block diagram showing a rise timing correction circuit of the conceivable semiconductor laser control apparatus shown in FIG. 2.
Figure 4:
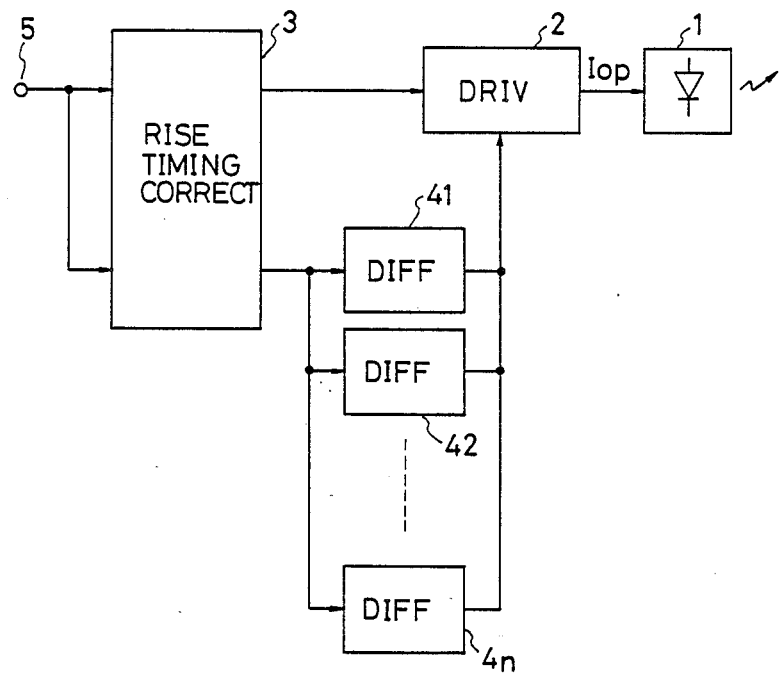
FIG. 4 is a system block diagram showing another conceivable semiconductor laser control apparatus.
Figure 5A:
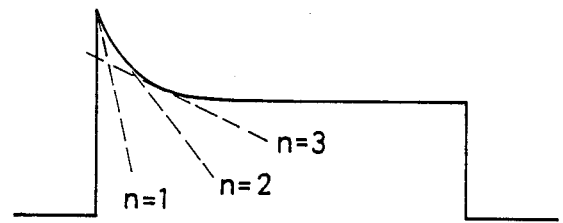
Figure 6:
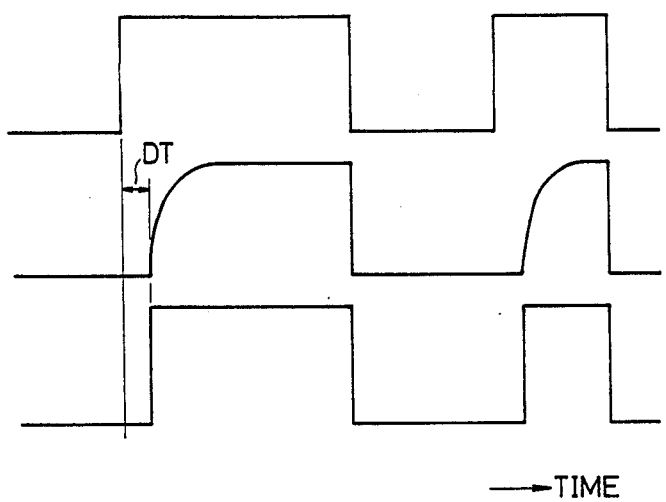
FIGS. 6(A) through 6(C) are timing charts for explaining the problems of the conceivable semiconductor laser control apparatuses.
Figure 7:
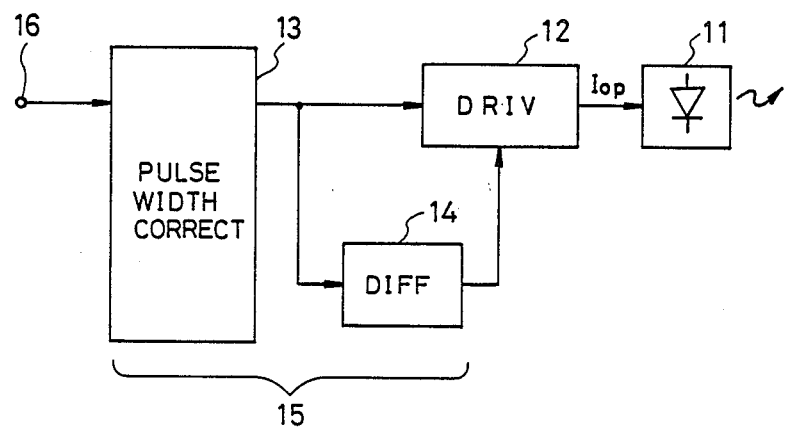
FIG. 7 is a system block diagram showing an embodiment of a semiconductor laser control apparatus according to the present invention.

FIG. 7 shows an embodiment of a semiconductor laser control apparatus according to the present invention. The semiconductor laser control apparatus has a driving circuit 12 for supplying a driving current to a semiconductor laser 11, a pulse width correction circuit 13 coupled to the driving circuit 12, and a differentiating circuit 14 coupled between the driving circuit 12 and the pulse width correction circuit 13. A modulation signal is supplied to the pulse width correction circuit 13 through a terminal 16. The pulse width correction circuit 13 in combination with the differentiating circuit 14 act as a correcting means 15 for correcting a deviation of the optical output of the semiconductor laser 11.

Figure 8:
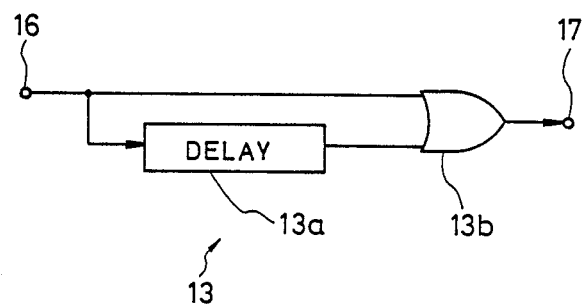
FIG. 8 is a system block diagram showing an embodiment of an essential part of the semiconductor laser control apparatus shown in FIG. 7.

The pulse width correction circuit 13 may have a circuit construction shown in FIG. 8. In FIG. 8, the pulse width correction circuit 13 has a delay line 13a and an OR circuit 13b. The modulation signal from the terminal 16 is delayed in the delay line 13a and supplied to one input terminal of the OR circuit 13b. On the other hand, the modulation signal from the terminal 16 is supplied directly to the other input terminal of the OR circuit 13b. An output signal of the OR circuit 13b obtained through a terminal 17 and is supplied to the driving circuit 12 as a phase delayed signal so as to adjust a timing with which the correction is made with respect to the optical output of the semiconductor laser 11. The output signal of the OR circuit 13b is also supplied to the driving circuit 12. Hence, a driving timing of the driving circuit 12 is controlled by the signal from the pulse width correction circuit 13, that is, either the modulation signal or the phase delayed signal the timing of which is adjusted for the correction of the optical output.

Accordingly, with respect to the operation end timing determined by the modulation signal, the semiconductor laser 11 ends the operation at a time delayed from a falling edge of the modulation signal when the phase delayed signal is outputted with the delay.

In addition, the differentiating circuit 14 differentiates the modulation signal which is supplied to the driving circuit 12 so as to supply a constant correction current to the semiconductor laser 11 when the semiconductor laser 1 is ON. Hence, the deviation of the optical output of the semiconductor laser 11 is corrected.

Figure 9:
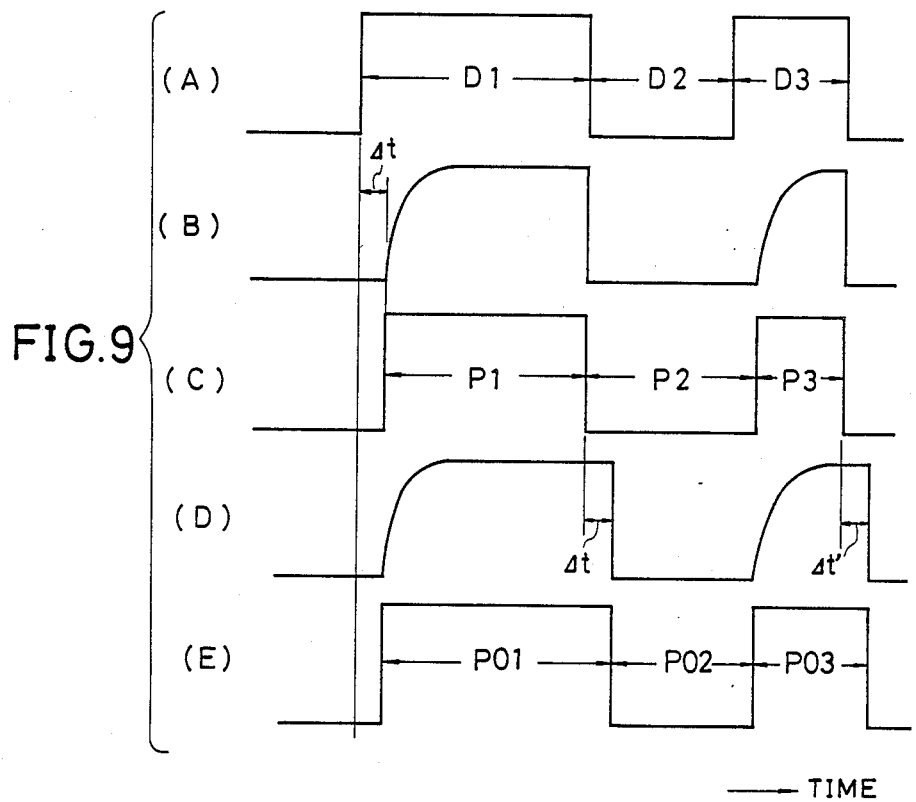
FIGS. 9(A) through 9(E) are timing charts for explaining the operation of the embodiment of the semiconductor laser control apparatus.

Hence, according to this embodiment, a rising edge of the driving current $I_{op}$ supplied to the semiconductor laser 11 after the correction of the deviation of the optical output of the semiconductor laser 11 is delayed with respect to the modulation signal depending on the correction quantity, and the optical output of the semiconductor laser 11 is obtained in correspondence with this rising edge of the driving current $I_{op}$. FIG. 9(A) shows the modulation signal, FIG. 9(B) shows the driving current $I_{op}$ after the correction, and FIG. 9(C) shows the optical output of the 10 semiconductor laser 11 after the correction. Further, FIG. 9(D) shows the driving current $I_{op}$ which is corrected and the falling edge delayed, and FIG. 9(E) shows the optical output of the semiconductor laser 11 which is corrected and the falling edge delayed.

The semiconductor laser 11 operates from the rising edge of the driving current $I_{op}$ and the supply of the driving current $I_{op}$ to the semiconductor laser 11 is ended when the modulation signal falls. However, the phase delayed signal from the delay line 13a is supplied to the OR circuit 13b in the pulse width correction circuit 13. As a result, the supply of the driving current $I_{op}$ to the semiconductor laser 11 continues until the falling edge of the driving current $I_{op}$ dependent on the delay in the operation start time of the semiconductor laser 11, and the operating time of the semiconductor laser 11 corresponds to the applying time of the modulation signal to the terminal 16. In other words, the following relations stand in FIGS. 9(A) through 9(E).

$D1 = P01 > P1$
$D2 = P02 > P2$
$D3 = P03 > P2$

Accordingly, the image reproducing time determined by the modulation signal and the actual image reproducing time of the semiconductor laser 11 coincide.

Figure 10:
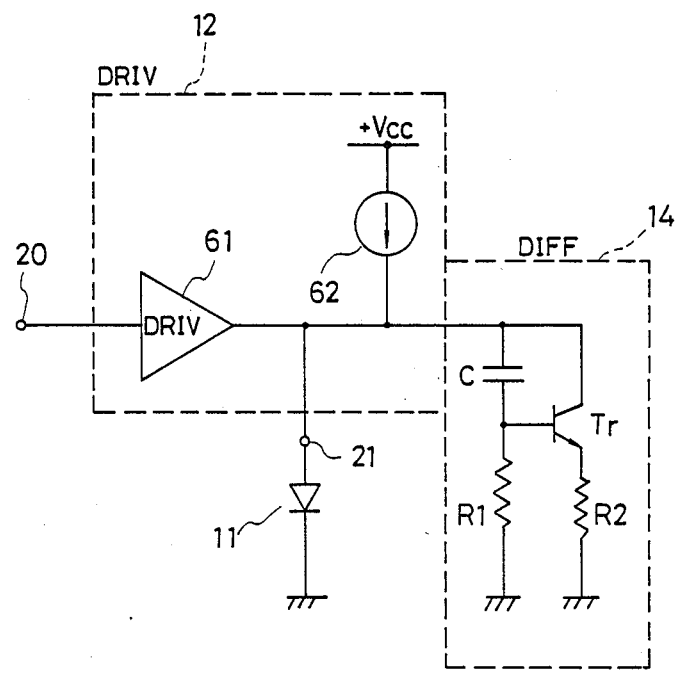
FIG. 10 is a circuit diagram showing an embodiment of another essential part of the semiconductor laser control apparatus shown in FIG. 7.

FIG. 10 shows an embodiment of a circuit part made up of the driving circuit 12 and the differentiating circuit 14. In FIG. 10, the driving circuit 12 has a switching driver 61 and a current source 62 which are connected as shown. The differentiating circuit 14 has a capacitor C, resistors R1 and R2 and a transistor Tr which are connected as shown. +Vcc denotes a power source voltage. The output signal of the pulse width correction circuit 13 (from the terminal 17 shown in FIG. 8, for example) is supplied to the switching driver 61 of the driving circuit 12. The driving current $I_{op}$ from the driving circuit 12 is obtained from a terminal 21 and is supplied to the semiconductor laser 11.

Further, the present invention is not limited to these embodiments, but various variations and modifications may be made without departing from the scope of the present invention.

What is claimed is:

1. A semiconductor laser control apparatus for controlling an optical output of a semiconductor laser, said semiconductor laser control apparatus comprising:
    terminal means for receiving a modulation signal which determines ON and OFF states of the semiconductor laser;
    correcting means supplied with the modulation signal from said terminal means for outputting a processed modulation signal; and
    driving means supplied with the processed modulation signal from said correcting means for supplying a driving signal to the semiconductor laser,
    said correcting means including differentiating means responsive to the processed modulation signal for supplying a correction signal having a predetermined time constant to said driving means when the semiconductor laser is ON so as to maintain the optical output of the semiconductor laser constant, and pulse width correcting means for correcting a pulse width of the modulation signal to obtain the processed modulation signal, said processed modulation signal being supplied to said driving means so that the semiconductor laser is ON and operates until a time which is delayed by a predetermined delay time from an operation end time determined by the modulation signal received at said terminal means.

2. The semiconductor laser control apparatus as claimed in claim 1 wherein said predetermined delay time is equal to a delay time in a transition edge of the driving signal outputted from said driving means responsive to the correction signal from said differentiating means with respect to a corresponding transition edge of the modulation signal received at said terminal means.

3. The semiconductor laser control apparatus as claimed in claim 2 wherein the transition edge of the driving signal and the transition edge of the modulation signal respectively are rising edges.

4. The semiconductor laser control apparatus as claimed in claim 2 wherein said pulse width correcting means includes a delay line supplied with the modulation signal from said terminal means and an OR circuit supplied with an output signal of said delay line and the modulation signal from said terminal means, said OR circuit supplying an output signal thereof to said driving means as the processed modulation signal.

5. The semiconductor laser control apparatus as claimed in claim 1 wherein said pulse width correcting means includes a delay line supplied with the modulation signal from said terminal means and an OR circuit supplied with an output signal of said delay line and the modulation signal from said terminal means, said OR circuit supplying an output signal thereof to said driving means as the processed modulation signal.

6. The semiconductor laser control apparatus as claimed in claim 1 wherein said driving means outputs such a driving signal that the semiconductor laser is turned ON during a time equal to a first logic level period of the modulation signal received at said terminal means and is turned OFF during a time equal to a second logic level period of the modulation signal, said first and second logic level periods having mutually different logic levels.

7. The semiconductor laser control apparatus as claimed in claim 6 wherein said first logic level period is a high-level period and said second logic level period is a low-level period.

8. The semiconductor laser control apparatus as claimed in claim 6 wherein said pulse width correcting means includes a delay line supplied with he modulation signal from said terminal means and an OR circuit supplied with an output signal of said delay line and the modulation signal from said terminal means, said OR circuit supplying an output signal thereof to said driving means as the processed modulation signal.

9. The semiconductor laser control apparatus as claimed in claim 1 wherein said driving means includes a switching driver supplied with the processed modulation signal and a current source coupled between a power source voltage and an output of said switching driver, said driving means outputting the driving signal from the output of said switching driver.

10. The semiconductor laser control apparatus as claimed in claim 1 wherein said differentiating means includes a capacitor having first and second terminals, a resistor coupled between the first terminal of said capacitor and ground, and a transistor having a base coupled to the first terminal of said capacitor, a collector coupled to the second terminal of said capacitor and an emitter which is grounded through another resistor, said capacitor receiving the processed modulation signal at the second terminal.

11. The semiconductor laser control apparatus as claimed in claim 1 wherein said driving means includes a switching driver supplied with the processed modulation signal and a current source coupled between a power source voltage and an output of said switching driver, said driving means outputting the driving signal from the output of said switching driver, and said differentiating means includes a capacitor having first and second terminals, a resistor coupled between the first terminal of said capacitor and ground, and a transistor having a base coupled to the first terminal of said capacitor, a collector coupled to the second terminal of said capacitor and an emitter which is grounded through another resistor, said capacitor receiving the processed modulation signal at the second terminal through said switching driver.

* * * * *